United States Patent
Carcia et al.

(10) Patent No.: US 6,756,161 B2
(45) Date of Patent: Jun. 29, 2004

(54) ION-BEAM DEPOSITION PROCESS FOR MANUFACTURE OF BINARY PHOTOMASK BLANKS

(75) Inventors: Peter Francis Carcia, Wilmington, DE (US); Laurent Dieu, Austin, TX (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 162 days.

(21) Appl. No.: 10/123,749

(22) Filed: Apr. 16, 2002

(65) Prior Publication Data

US 2003/0194616 A1 Oct. 16, 2003

(51) Int. Cl.[7] .............................. G03F 9/00; C23C 14/00
(52) U.S. Cl. ...................................... 430/5; 204/192.25
(58) Field of Search ........................... 430/5; 428/432; 204/192.15, 192.22, 192.25

(56) References Cited

U.S. PATENT DOCUMENTS 6,335,124 B1 * 1/2002 Mitsui et al. .................. 430/5
2002/0119378 A1 * 8/2002 Angelopoulos et al. ........ 430/5

OTHER PUBLICATIONS

Waits, Robert K. "Planar Magnetron Sputtering", Thin Film Processes, (1978), pp. 131–134, vol. 11 (4) Cupertino, California.

* cited by examiner

Primary Examiner—Stephen Rosasco

(57) ABSTRACT

An ion-beam film deposition process is described for fabricating binary photomask blanks for selected lithographic wavelengths <400 nm, the said film essentially consisting of the $MO_xC_yN_z$ compound where M is selected from chromium, molybdenum, tungsten, or tantalum or combination thereof in a single layer or a multiple layer configuration.

5 Claims, 2 Drawing Sheets

ION-BEAM DEPOSITION PROCESS FOR MANUFACTURE OF BINARY PHOTOMASK BLANKS

FIELD OF INVENTION

This invention relates to manufacture of binary photomask blanks in photolithography, using the ion-beam deposition technique. These masks can be used with short wavelength (i.e., <400 nanometer) light. Additionally, this invention relates to binary photomask blanks with single or multi-layered coating of chromium, molybdenum, tungsten, or tantalum metal and/or its compounds or combinations thereof, on the blanks.

TECHNICAL BACKGROUND

Microlithography is the process of transferring microscopic circuit patterns or images, usually through a photomask, on to a silicon wafer. In the production of integrated circuits for computer microprocessors and memory devices, the image of an electronic circuit is projected, usually with an electromagnetic wave source, through a mask or stencil on to a photosensitive layer or resist applied to the silicon wafer. Generally, the mask is a layer of "chrome" patterned with these circuit features on a transparent quartz substrate. Often referred to as a "binary" mask, a "chrome" mask transmits imaging radiation through the pattern where "chrome" has been removed. The radiation is blocked in regions where the "chrome" layer is present.

The electronics industry seeks to extend optical lithography for manufacture of high-density integrated circuits to critical dimensions of less than 100 nanometer (nm). However, as the feature size decreases, resolution for imaging the minimum feature size on the wafer with a particular wavelength of light is limited by the diffraction of light. Therefore, shorter wavelength light, i.e. less than 400 nm are required for imaging finer features. Wavelengths targeted for succeeding optical lithography generations include 248 nm (KrF laser wavelength), 193 nm (ArF laser wavelength), and 157 nm ($F_2$ laser wavelength) and lower.

Physical methods of thin film deposition are preferred for manufacture of photomask blanks. These methods, which are normally carried out in a vacuum chamber, include glow discharge sputter deposition, cylindrical magnetron sputtering, planar magnetron sputtering, and ion beam deposition. A detailed description of each method can be found in the reference "Thin Film Processes," Vossen and Kern, Editors, Academic Press NY, 1978). The method for fabricating thin film masks is almost universally planar magnetron sputtering.

The planar magnetron sputtering configuration consists of two parallel plate electrodes: one electrode holds the material to be deposited by sputtering and is called the cathode; while the second electrode or anode is where the substrate to be coated is placed. An electric potential, either RF or DC, applied between the negative cathode and positive anode in the presence of a gas (e.g., Ar) or mixture of gases (e.g., $Ar+O_2$) creates a plasma discharge (positively ionized gas species and negatively charged electrons) from which ions migrate and are accelerated to the cathode, where they sputter or deposit the target material on to the substrate. The presence of a magnetic field in the vicinity of the cathode (magnetron sputtering) intensifies the plasma density and consequently the rate of sputter deposition.

If the sputtering target is a metal such as chromium (Cr), sputtering with an inert gas such as Ar will produce metallic films of Cr on the substrate. When the discharge contains reactive gases, such as $O_2$, $N_2$, $CO_2$, or $CH_3$, they combine with the target or at the growing film surface to form a thin film of oxide, nitride, carbide, or combination thereof, on the substrate. Usually the chemical composition of a binary mask is complex and often, the chemistry is graded or layered through the film thickness. A "chrome" binary mask is usually comprised of a chrome oxy-carbo-nitride ($CrO_xC_yN_z$) composition that is oxide-rich at the film's top surface and more nitride-rich within the depth of the film. The oxide-rich top surface imparts anti-reflection character, and chemically grading the film provides attractive anisotropic wet etch properties, while the nitride-rich composition contributes high optical absorption.

In ion-beam deposition (IBD), the plasma discharge is contained in a separate chamber (ion "gun" or source) and ions are extracted and accelerated by an electric potential impressed on a series of grids at the "exit port" of the gun (ion extraction schemes that are gridless, are also possible). The IBD process provides a cleaner process (fewer added particles) at the growing film surface, as compared to planar magnetron sputtering because the plasma, that traps and transports charged particles to the substrate, is not in the proximity of the growing film as in sputtering. Moreover, the need to make blanks with fewer defects is imperative for next generation lithographies where critical circuit features will shrink below 0.1 micron. Additionally, the IBD process operates at a total gas pressure at least ten times lower than traditional magnetron sputtering processes (a typical pressure for IBD is ~$10^{-4}$ Torr.). This results in reduced levels of chemical contamination. For example, a nitride film with minimum or no oxide content can be deposited by this process. Furthermore, the IBD process has the ability to independently control the deposition flux and the reactive gas ion flux (current) and energy, which are coupled and not independently controllable in planar magnetron sputtering. The capability to grow oxides or nitrides or other chemical compounds with a separate ion gun that bombards the growing film with a low energy, but high flux of oxygen or nitrogen ions is unique to the IBD process and offers precise control of film chemistry and other film properties over a broad process range. Additionally, in a dual ion beam deposition the angles between the target, the substrate, and the ion guns can be adjusted to optimize for film uniformity and film stress, whereas the geometry in magnetron sputtering is constrained to a parallel plate electrode system.

While magnetron sputtering is extensively used in the electronics industry for reproducibly depositing different types of coatings, process control in sputtering plasmas is inaccurate because the direction, energy, and flux of the ions incident on the growing film cannot be regulated (ref: The Material Science of Thin Films, Milton Ohring, Academic Press 1992, p. 137). In dual ion beam deposition proposed here as a novel alternative for fabricating masks with simple or complex, single-layered or multi-layered chemistries, independent control of these deposition parameters is possible.

SUMMARY OF THE INVENTION

This invention concerns an ion-beam deposition process for preparing a binary photo mask blank for lithographic wavelengths less than 400 nanometer, the process comprising depositing at least one layer of a $MO_xC_yN_z$ compound, where M is selected from the group consisting of chromium, molybdenum, tungsten, or tantalum or a combination thereof, on a substrate by ion beam deposition of chromium, molybdenum, tungsten, or tantalum and/or a compound thereof by ions from a group of gases;

wherein:
  x ranges from about 0.00 to about 3.00;
  y ranges from about 0.00 to about 1.00;
  and z ranges from about 0.00 to about 2.00.

More specifically, this invention concerns a dual ion-beam deposition process for preparing a binary photo mask blank for lithographic wavelengths less than 400 nanometer, the process comprising depositing at least one layer of a $MO_xC_yN_z$ compound, where M is selected from chromium, molybdenum, tungsten, or tantalum or combination thereof, on a substrate;

(a) by ion beam deposition of chromium, molybdenum, tungsten, or tantalum and/or a compound thereof by ions from a group of gases, and (b) by bombarding the said substrate by a secondary ion beam from an assist source of a group of gases wherein the layer or the layers are formed by a chemical combination of the bombarding gas ions from the assist source gas with the material deposited from the target or targets onto the substrate;

wherein:
  x ranges from about 0.00 to about 3.00;
  y ranges from about 0.00 to about 1.00;
  and z ranges from about 0.00 to about 2.00.

DETAILED DESCRIPTION OF THE INVENTION

Certain terms used herein are defined below.

In this invention, it is to be understood that the term "photomask" or the term "photomask blank" is used herein in the broadest sense to include both patterned and UN-patterned photomask blanks. The term "multilayers" is used to refer to photomask blanks comprised of layers of films deposited with distinct boundaries between the two layers or a distinct change in at least one optical property between two regions. The layers can be ultra-thin (1–2 monolayers) or much thicker. The layering controls optical and etch properties of the photomask blank.

Optical density of the binary blank is defined as the logarithm of the base of 10 of the ratio of the intensity of the incident light to the intensity of the transmitted light.

Single Ion Beam Deposition Process

A typical configuration for a single ion beam deposition process is shown in FIG. 2. It is understood that this system is in a chamber with atmospheric gases evacuated by vacuum pumps. In the single IBD process, an energized beam of ions (usually neutralized by an electron source) is directed from a deposition gun (1) to a target material (2) supported by target holder (3) which is sputtered when the bombarding ions have energy above a sputtering threshold energy for that specific material, typically ~50 eV. The ions from the deposition-gun (1) are usually from an inert gas source such as He, Ne, Ar, Kr, Xe, although reactive gases such as $O_2$, $N_2$, $CO_2$, $F_2$, $CH_3$, or combinations thereof, can also be used. When these ions are from an inert gas source the target material is sputtered and then deposits as a film on the substrate (4), shown with substrate holder (5). When these ions are from a reactive gas source they can combine with target material (2) and the product of this chemical combination is what is sputtered and deposited as a film on the substrate (4).

Commonly, the bombarding ions should have energies of several hundred eV—a range of 200 eV to 10 KeV being preferred. The ion flux or current should be sufficiently high ($>10^{13}$ ions/cm$^2$/s) to maintain practical deposition rates ($>0.1$ nm/min). Typically, the process pressure is about $10^{-4}$ Torr, with a preferred range $10^{-3}$–$10^{-5}$ Torr. The target material can be elemental, such as Cr, Mo, Ta, W, or it can be multi-component such as $Mo_xCr_y$, or it can be a compound such as CrN. The substrate can be positioned at a distance and orientation to the target that optimize film properties such as thickness uniformity, minimum stress, etc.

The process window or latitude for achieving one film property, for example, optical density, can be broadened with the dual ion-beam deposition process. Also, one particular film property can be changed independently of other set of properties with the dual ion-beam process.

Dual Ion-Beam Deposition Process

The ion-beam process embodies in photomask manufacture a process with fewer added (defect) particles, greater film density with superior opacity, and superior smoothness with reduced optical scattering, especially critical for lithographic wavelength <400 nm. The dual ion gun configuration is shown schematically in FIG. 1. In this process, an energetic beam of ions (usually neutralized by an electron source) is directed from a deposition gun (1) to a target (2) which is sputtered when the bombarding ions have energy above a sputtering threshold, typically ~50 eV. The ions from the deposition-gun are usually from an inert gas source such as He, Ne, Ar, Kr, Xe, although reactive gases such as $O_2$, $N_2$, $CO_2$, $F_2$, $CH_3$, or combinations thereof, can also be used. When these ions are from an inert gas source they sputter the target material (2), e.g. Cr metal, which deposits as a film on the substrate (4). When these gas ions are from a reactive source, e.g. oxygen, they can chemically combine at the target surface and then the product of this chemical combination is what is sputtered and deposited as a film on the substrate. In dual ion beam deposition, energetic ions from a second gun or assist source bombard the substrate. Commonly, ions from the assist gun (6) are selected from the group of reactive gases such as, but not restricted to $O_2$, $N_2$, $CO_2$, $F_2$, $CH_3$, or combinations thereof, which chemically combine at the substrate with the flux of material sputtered from the target (2). Therefore, if Ar ions from the deposition gun (1) are used to sputter a Cr target while oxygen ions from the assist source bombard the growing film, the Cr flux will chemically combine with energetic oxygen ions at the substrate, forming a film of chrome oxide.

Commonly, the bombarding ions from the deposition source should have energies of several hundred eV—a range of 200 eV to 10 KeV being preferred. The ion flux or current should be sufficiently high ($>10^{13}$ ions/cm$^2$/s) to maintain practical deposition rates ($>0.1$ nm/min). Typically, the process pressure is about $10^{-4}$ Torr, with a preferred range $10^{-3}$–$10^{-5}$ Torr. The preferred target materials of this invention are elemental Cr, Mo, W, Ta or their compounds. The substrate can be positioned at a distance and orientation to the target that optimize film properties such as thickness uniformity, minimum stress, etc. The energy of ions from the assist gun (6) is usually lower than the deposition gun (1). The assist gun provides an adjustable flux of low energy ions that react with the sputtered atoms at the growing film surface. For the "assist" ions, lower energy typically <500 eV is preferred, otherwise the ions may cause undesirable etching or removal of the film. In the extreme case of too high a removal rate, film growth is negligible because the removal rate exceeds the accumulation or growth rate. However, in some cases, higher assist energies may impart beneficial properties to the growing film, such as reduced stress, but the preferred flux of these more energetic ions is usually required to be less than the flux of depositing atoms.

In dual ion beam deposition of photomask blanks the gas ion source for the deposition process is preferably selected from the group of inert gases including, but not restricted to He, Ne, Ar, Kr, Xe or combinations thereof, while the gas ion source for the assist bombardment is preferably selected from the group of reactive gases including, but not restricted to $O_2$, $N_2$, $CO_2$, $F_2$, $CH_3$, or combinations thereof. However, in special circumstances the deposition gas source may also contain a proportion of a reactive gas, especially when formation of a chemical compound at the target is favorable for the process. Conversely, there may be special circumstances when the assist gas source is comprised of a proportion of an inert gas, especially when energetic bombardment of the growing film is favorable for modifying film properties, such as reducing internal film stress.

The capability to grow oxides or nitrides or other chemical compounds with a separate assist ion gun that bombards the growing film with a low energy, but high flux of oxygen or nitrogen ions is unique to the IBD process and offers precise control of film chemistry and other film properties over a broad process range. Additionally, in a dual ion beam deposition the angles between the target, the substrate, and the ion guns can be adjusted to optimize for film uniformity and film stress, whereas the geometry in magnetron sputtering is constrained to a parallel plate electrode system.

With the dual IBD process, any of these deposition operations can be combined to make more complicated structures. For example a $CrO_x/CrN_y$ layered stack can be made by depositing from elemental Cr target as the film is successively bombarded first by reactive nitrogen ions from the assist gun, followed by bombardment with oxygen ions. When the layers in a stack alternate from an oxide to a nitride as in CrOx/CrNy, dual ion beam deposition with a single Cr target offers significant advantage over traditional magnetron sputtering techniques. Whereas the assist source in dual IBD can be rapidly switched between $O_2$ and $N_2$ as Cr atoms are deposited, reactive magnetron sputtering produces an oxide layer on the target surface that must be displaced before forming a nitride-rich surface for sputtering a nitride layer.

While it is possible to make films with complex chemical compounds, such as $Si_3N_4$, with ion beam deposition using a single ion source, the process is more restrictive than for dual ion beam deposition. For example, Huang et al. in "Structure and composition studies for silicon nitride thin films deposited by single ion beam sputter deposition" *Thin Solid Films* 299 (1997) 104–109, demonstrated that films with $Si_3N_4$ properties only form when the beam voltage is in a narrow range about 800 V. In dual ion beam sputtering the flux of nitrogen atoms from the assist source can be adjusted independently to match the flux of deposited target atoms from the deposition ion source over a wide range of process conditions and at practical deposition rates.

This invention relates to the dual ion beam deposition process for depositing a single layer or multiple layers of chromium, molybdenum, tungsten, or tantalum compounds of the general formula of, $MO_xC_yN_z$ where M is chromium, molybdenum, tungsten, or tantalum on quartz or glass substrate for manufacturing opaque photomask blanks.

This invention provides a novel deposition technique of single or multiple layer film for photomask blanks for incident wavelengths less than 400 nm. The substrate can be any mechanically stable material, which is transparent to the wavelength of incident light used. Substrates such as quartz, $CaF_2$, and fused silica (glass) are preferred for availability and cost.

This invention provides dual ion-beam deposition of a single layer with a high optical density or opacity material where the chemistry is graded in the film thickness direction.

Preferably, this invention embodies dual ion-beam deposition of single or multiple layers of $MO_xC_yN_z$, where M is selected from chromium, molybdenum, tungsten, or tantalum or combination thereof, where x ranges from about 0.00 to about 3.00, y ranges from about 0.00 to about 1.00, and z ranges from about 0.00 to 2.00.

Preferably, this invention embodies photomask blanks of the $MO_xC_yN_z$ type, where the optical density is more than about two units.

Optical Properties

The optical properties (index of refraction, "n" and extinction coefficient, "k") were determined from variable angle spectroscopic ellipsometry at three incident angles from 186–800 nm, corresponding to an energy range of 1.5–6.65 eV, in combination with optical reflection and transmission data. From knowledge of the spectral dependence of optical properties, the film thickness, optical transmissivity, and reflectivity can be calculated. See generally, O. S. Heavens, *Optical Properties of Thin Solid Films*, pp 55–62, Dover, N.Y., 1991, incorporated herein by reference.

EXAMPLE

Figure 1:
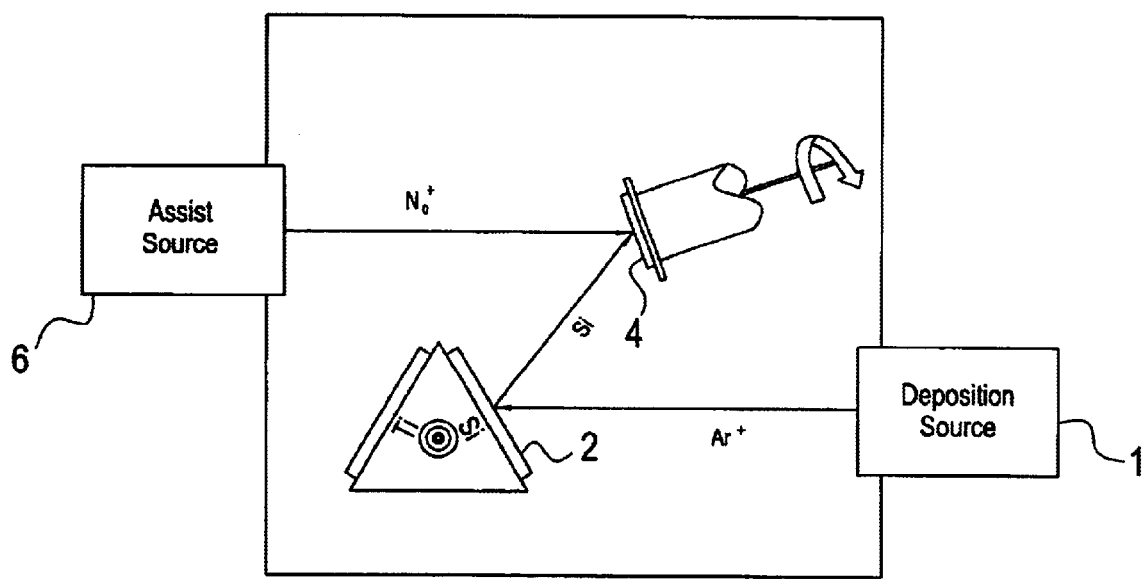
FIG. 1: Schematic for the dual ion-beam deposition process.
Figure 2:
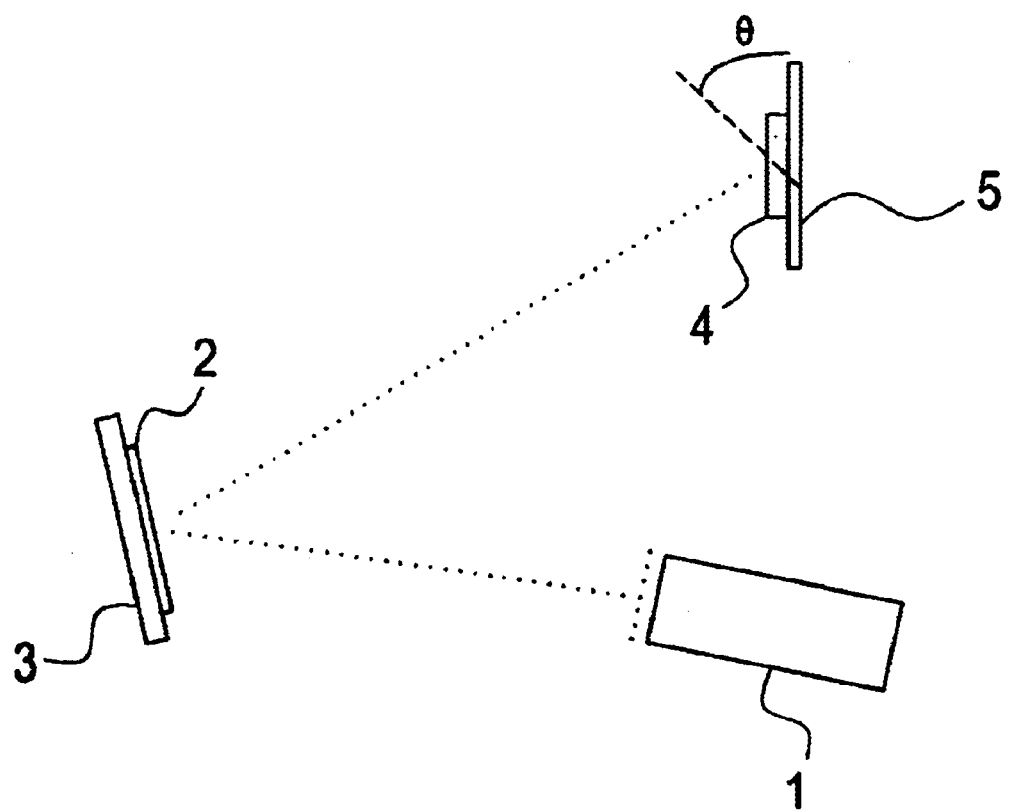
FIG. 2: Representation of single ion beam deposition process for silicon nitride, using silicon (Si) target with sputtered by nitrogen and argon ions from a single ion source or "gun".

Opaque "Chrome" Mask $CrC_xO_yN_z$ films, commonly used as a mask in traditional photolithography, were made by dual ion beam deposition in a commercial tool (Veeco IBD-210) from a Cr target. During deposition from the Cr target, the chemistry of the growing film was tailored by bombarding it with low energy ions derived from a gas mixture of $CO_2$ and $N_2$ diluted with Ar. The deposition ion beam source was operated at a voltage of 1500 V at a beam current of 200 mA, using 4 sccm of Xe. The assist source with 18 sccm of $N_2$, 4 sccm of $CO_2$ and 2 sccm of Ar was operated at 100 V and a current of 150 mA. The substrate was a five-inch square quartz plate, 0.09 inch thick. The deposition was continued for 15 min and yielded a film about 238 nm thick with an optical density measured at 248 nm of greater than 3, adequate for binary mask application in photolithography. A depth profile of the chemical composition of the film obtained by X-ray photoelectron spectroscopy revealed a Cr content of about 60%, a nitrogen content of about 21%, an oxygen content of 19%, and a carbon content of less than 1%.

What is claimed is:

1. A dual ion-beam deposition process for preparing a binary photo mask blank for lithographic wavelengths less than 400 nanometer, the process comprising depositing at least one layer of a $MO_xC_yN_z$ compound, where M is selected from chromium, molybdenum, tungsten, or tantalum or combination thereof, on a substrate;

(a) by ion beam deposition of chromium, molybdenum, tungsten, or tantalum and/or a compound thereof by ions from a group of gases, and (b) by bombarding the said substrate by a secondary ion beam from an assist source of a group of gases wherein the layer or the layers are formed by a chemical combination of the bombarding gas ions from the assist source gas with the material deposited from the target or targets onto the substrate;

wherein:

x ranges from about 0.00 to about 3.00;

y ranges from about 0.00 to about 1.00;

and z ranges from about 0.00 to about 2.00.

2. The process of claim 1 where the gases in step (a) are selected from the group consisting of He, Ne, Ar, Kr, Xe, $CO_2$, $N_2$, $O_2$, $F_2$ $CH_3$, $N_2O$, $H_2O$, $NH_3$, $CF_4$, $CH_4$, $C_2H_2$, or a combination of gases thereof.

3. The process of claim 1 where the gases in step (b) are selected from the group consisting of He, Ne, Ar, Kr, Xe, $CO_2$, $N_2$, $O_2$, $F_2$, $CH_3$, $N_2O$, $H_2O$, $NH_3$, $CF_4$, $CH_4$, $C_2H_2$, or a combination of gases thereof.

4. The photomask blank made as in claim 1, wherein the selected lithographic wavelength is selected from the group consisting of 157 nm, 193 nm, 248 nm, and 365 nm.

5. The photomask blank made as in claim 1, wherein the opacity or the optical density of the deposited film is greater than about 2 units.

* * * * *